United States Patent

Lecuyer et al.

Patent Number: 5,915,223
Date of Patent: Jun. 22, 1999

[54] MULTIMODE RADIOTELEPHONE

[75] Inventors: Mathieu Lecuyer, Caen; Bruno Logoguez, Clamart, both of France

[73] Assignee: U.S. Philips Corporation, New York, N.Y.

[21] Appl. No.: 08/801,227

[22] Filed: Feb. 19, 1997

[30] Foreign Application Priority Data

Feb. 21, 1996 [FR] France .................................. 96 02150

[51] Int. Cl.⁶ ............... H04B 1/38; H04B 1/26; H04M 1/00
[52] U.S. Cl. .................. 455/552; 455/180.1; 455/190.1; 455/193.1; 455/323
[58] Field of Search ................... 455/118, 120, 455/121, 123, 552, 553, 180.1, 188.1, 193.1, 193.3, 195.1, 292, 280, 285, 302, 303, 179.1, 326, 190.1, 323

[56] References Cited

U.S. PATENT DOCUMENTS

| | | | |
|---|---|---|---|
| 3,054,057 | 9/1962 | Bettin et al. | 455/193.1 |
| 3,639,686 | 2/1972 | Walker et al. | 455/179.1 |
| 3,767,112 | 10/1973 | Tonari | 455/180.1 |
| 4,115,737 | 9/1978 | Hongu et al. | 455/285 |
| 4,132,952 | 1/1979 | Hongu et al. | 455/180.1 |
| 4,167,703 | 9/1979 | Suwa et al. | 455/180.1 |
| 4,234,965 | 11/1980 | Bickley et al. | 455/120 |
| 4,408,347 | 10/1983 | Ash | 445/179.1 |
| 5,249,302 | 9/1993 | Metroka et al. | 455/552 |
| 5,280,636 | 1/1994 | Kelly et al. | 455/180.1 |
| 5,477,532 | 12/1995 | Hoshigami et al. | 455/82 |
| 5,530,928 | 6/1996 | Wheatley, III et al. | 455/326 |
| 5,548,840 | 8/1996 | Heck | 455/326 |
| 5,564,098 | 10/1996 | Rodal et al. | 455/303 |
| 5,630,213 | 5/1997 | Vannatta | 455/188.1 |

FOREIGN PATENT DOCUMENTS

0653851A2  5/1995  European Pat. Off. .

*Primary Examiner*—Nguyen Vo
*Attorney, Agent, or Firm*—Dicran Halajian

[57] ABSTRACT

A wireless telephone is disclosed having two antennas and associated filters tuned to first and second frequency bands, respectively. A selection device selects one of the antennas under the control of a frequency management device for connection to a transforming circuit. The transforming circuit includes a symmetrizing circuit which receives an asymmetric signal from one of the two antenna. The symmetrizing circuit is tuneable in response to a tuning voltage from a frequency management device. The symmetrizing circuit provides a symmetric output to an amplifier for amplification and subsequent conversion to an intermediate frequency using a mixer and a local oscillator.

4 Claims, 1 Drawing Sheet

MULTIMODE RADIOTELEPHONE

BACKGROUND OF THE INVENTION

The present invention relates to a radiotelephone arranged for transmitting or receiving signals in a first or second frequency band, comprising a first antenna and filter system intended to ensure the transmission or reception of signals in the first frequency band, a second antenna and filter system intended to ensure the transmission or reception of signals in the second frequency band, and a selection device for selecting the frequency band used and a frequency management device controlling said selection device, in which radiotelephone a frequency conversion from either frequency band to an intermediate frequency is realized by a single local oscillator and a single mixer.

A radiotelephone capable of operating with two types of transmission systems which have different characteristic features, for example, the GSM and DECT features, has already been proposed. In the document EP-A-653851 it is indicated that in this case an intermediate frequency could be advantageously selected as being substantially equal to half the frequency difference between the two frequency bands. Such a telephone requires only a single local oscillator and also a single mixer which then, on the basis of a center frequency between the two bands effect a change by a lower value from the highest transmission/receiving frequency and by a higher value from the lowest transmission/receiving frequency. Thus the doubling of certain functions of the telephone is avoided, which renders the telephone less expensive.

Other functions have thus far been considered hard to share by the two transmission systems, because these functions are strictly linked to the frequency they are subjected to.

OBJECT AND SUMMARY OF THE INVENTION

The present invention has particularly for its object to avoid a doubling of the low-noise amplifier which is intended to amplify the received signals before they are converted to an intermediate frequency.

Indeed, a radiotelephone of a type as defined in the opening paragraph is characterized in that it comprises a transforming circuit which has an asymmetrical input terminal and two output terminals forming a symmetrical output, receiving on its asymmetrical input an asymmetrical signal produced by one of the antenna and filter systems and producing on its symmetrical output a symmetrical output signal to be applied to the inputs of a single low-noise amplifier, said transforming circuit comprising a symmetrizing circuit which has an asymmetrical input and a symmetrical output which can be tuned to either frequency band by means of a tuning control voltage produced by the frequency management device.

The transforming circuit being capable of processing signals of the two frequency bands, the presence of a second low-noise amplifier is no longer necessary when the single amplifier is capable of amplifying signals of the two frequency bands.

According to an advantageous embodiment of the invention, the telephone is furthermore characterized in that the symmetrizing circuit has two T-cells arranged in parallel whose inputs are connected together and thus form the asymmetrical input of the symmetrizing circuit, each cell being formed by a phase shifting inductance and a phase shifting capacitor, the node between these elements forming the output of each cell, the outputs of the two cells forming the symmetrical output of the symmetrizing circuit, the phase shifting inductances and capacitors being arranged as a high-pass filter in one of the cells and a low-pass filter in the other, the phase shifting capacitors being variable capacitor diodes which are subjected to the tuning control voltage.

In order to simplify the embodiment of the invention, the phase shifting inductances have a value which is maintained at a fixed level. The value of the phase shifting capacitors is thus to be capable of varying in accordance with the square of the ratio between the frequencies used. In the case of GSM and DECT systems, the frequencies used vary roughly by a factor of two which makes it necessary to vary the value of the phase shifting capacitors by a factor of four. This is realized by a relatively standard type of variable capacitance diodes.

The input impedance of the low-noise amplifier varies as a function of the frequency of the signals it amplifies. A variant of the invention is characterized in that the transforming circuit comprises adapting means for adapting the impedance between the symmetrical output of the symmetrizing circuit and the input of the low-noise amplifier.

This adaptation of the impedance for coupling the symmetrizing circuit to the low-noise amplifier allows of a minimization of signal losses. Such an adaptation of the impedance is used in a preferred embodiment of the invention, characterized in that the impedance adapting means comprise:

two identical inductances called series adaptation inductances, whose value is lower than that of the phase shifting inductances and which are connected each between the output of a T-cell and one of the output terminals which form the symmetrical output of the transforming circuit, one parallel adaptation capacitor connected between the two outputs of the T-cells, and one series adaptation capacitor inserted between the asymmetrical input of the transforming circuit and that of the symmetrizing circuit.

By suitably selecting aforesaid adaptation elements, the impedance seen at the output of the symmetrizing circuit may be matched with the input impedance of the lownoise amplifier, although the latter varies considerably as a function of the frequency and in an unfavourable direction because of its capacitive component which comes from the parasitic input capacitance of the amplifier. The structure of the impedance adapting means according to the invention is noteworthy because it provides via fixed-value elements, an optimum adaptation of the impedances in their real components and a compensation of the reactive components in the two frequency bands used. The elements indicated above are determined accurately, for example, by means of a computer program in which the characteristic features of the input impedance of the low-noise amplifier are entered. As regards the impedance applied to the input of the symmetrizing circuit, it is determined by channel preselection filters for which mostly a value of 50 Ohms is provided.

These and other aspects of the invention are apparent from and will be elucidated with reference to the embodiments described hereinafter.

DETAILED DESCRIPTION OF THE PREFERRED EMBODIMENTS

Figure 1:
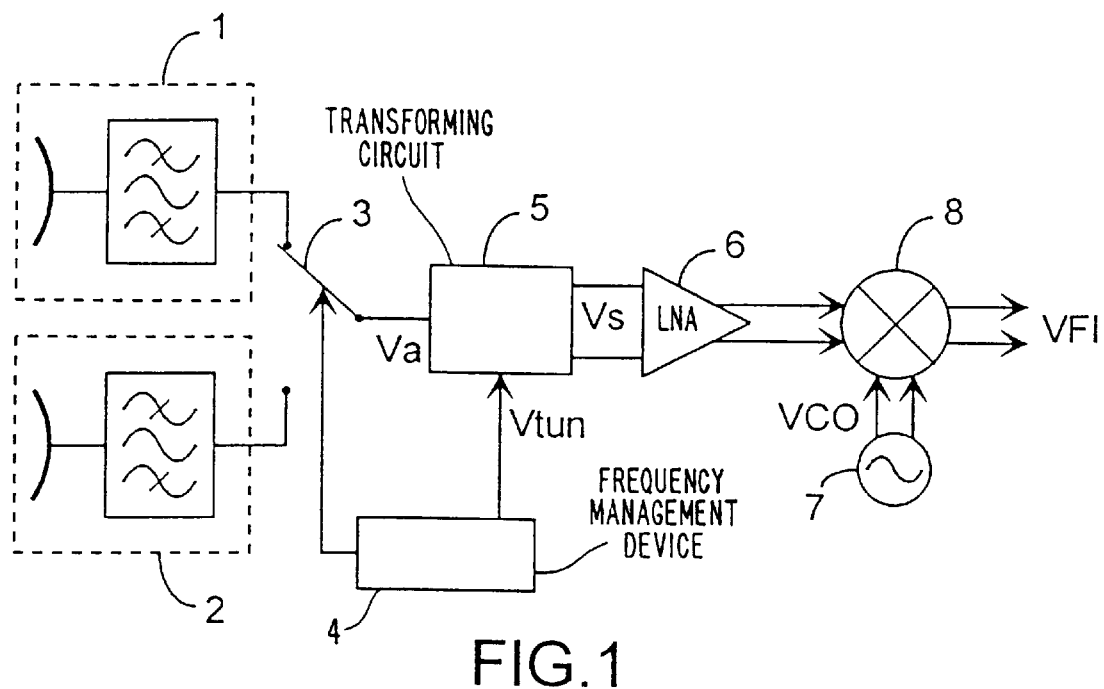
FIG. 1 is a partial operational diagram of a radiotelephone according to the invention.

FIG. 1 partially represents a radiotelephone according to the invention, arranged for transmitting or receiving signals in a first or a second frequency band. Within the scope of this description, the first frequency band corresponds to that of the signals according to the GSM standard, whose nominal carrier frequency F1 is of the order of 950 MHz, and the second frequency band corresponds to that of the signals according to the DECT standard, whose nominal carrier frequency F2 is of the order of 1880 MHz. The radiotelephone comprises a first antenna-cum-filter system (1) intended to ensure the transmission or reception of signals in the first frequency band, a second antenna-cum-filter system (2) intended to transmit or receive signals in the second frequency band, and a selection device (3) for selecting the frequency band used and a frequency management device (4) controlling said selection device (3). A frequency conversion from either frequency band to an intermediate frequency FI is effected by the radiotelephone via a single local oscillator (7) which applies to a mixer (8) a signal VCO whose frequency FLO is a center frequency between the frequencies F1 and F2 of these two frequency bands. The mixer (8) may advantageously comprise a device which permits of the rejection of the image frequency and the compensation for linearity faults of the low-noise amplifier (6). The telephone further comprises a transforming circuit (5) which has an asymmetrical input terminal and two output terminals which form a symmetrical output, receiving on its asymmetrical input an asymmetrical signal Va produced by one of the antenna-cum-filter systems (1 or 2) and producing on its symmetrical output a symmetrical output signal Vs which is to be applied to the inputs of a single low-noise amplifier (6). The transforming circuit (5) comprises a symmetrizing circuit (9) which has an asymmetrical input and a symmetrical output, which can be tuned by a voltage called tuning control voltage Vtun produced by the frequency management device (4) to one or the other of the two frequency bands. The transforming circuit (5) further includes impedance adapting means between the symmetrical output of the symmetrizing circuit (9) and the input of the low-noise amplifier (6).

The oscillator (7) and the mixer (8) effect, on the basis of the frequency FLO, a change by a lower value from the highest transmission/receiving frequency F2, and by a higher value from the lowest transmission/receiving frequency F1. The frequency FLO of the signal VCO produced by the oscillator (7) is defined such that FLO=(F2+F1)/2. In the present case, FLO will thus be of the order of 1415 MHz. When a signal having the frequency F2 is received, the mixer (8) will restore a signal having the frequency FI=F2−FLO=465 MHz, and when a signal having the frequency F1 is received, the mixer (8) will restore a signal having the same frequency FI=FLO−F1=465 MHz.

Figure 2:
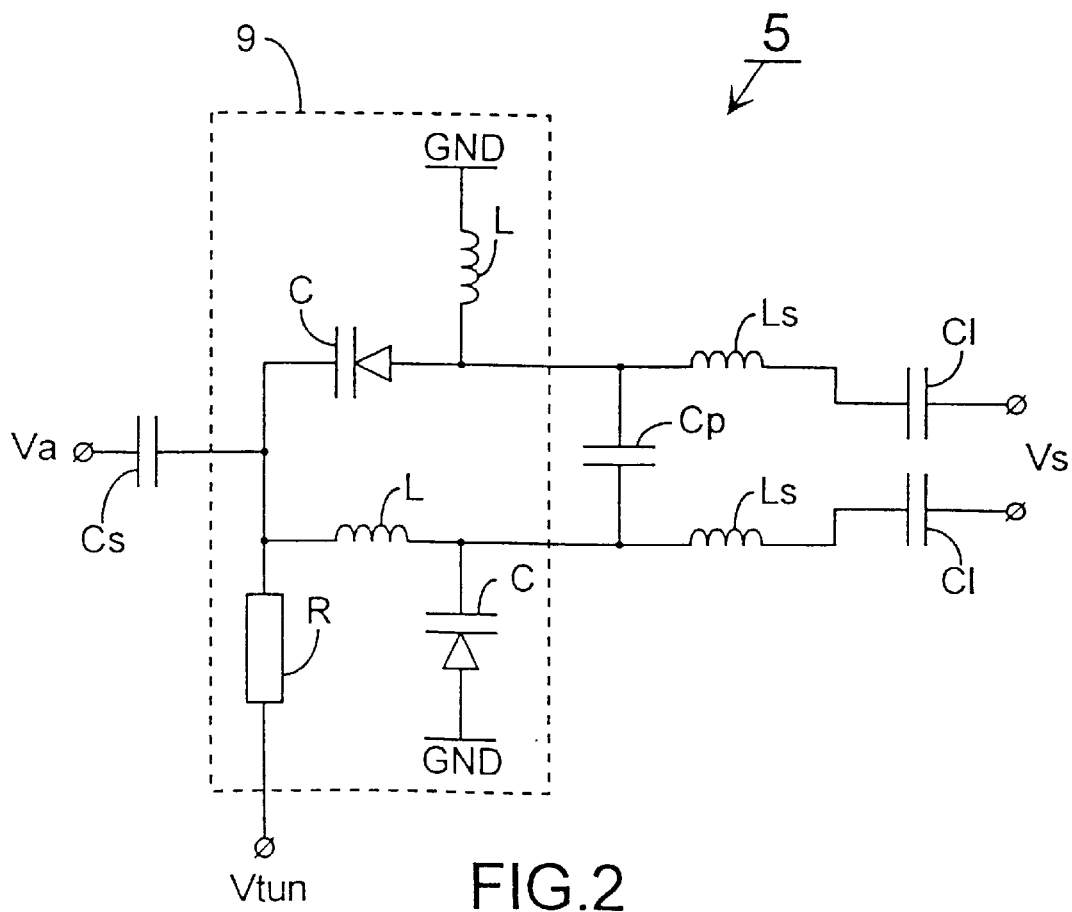
FIG. 2 is a partial operational diagram of a transforming circuit included in a radiotelephone according to a preferred embodiment of the invention.

FIG. 2 partially represents a transforming circuit (5) included in a radiotelephone according to a preferred embodiment of the invention. Such a transforming circuit (5) comprises a symmetrizing circuit (9) of the two T-cell type arranged in parallel, whose inputs are combined and thus form the asymmetrical input of the symmetrizing circuit (9). Each cell is formed by a phase shifting inductance L and a phase shifting capacitor C, the node between these elements forming the output of each cell. The outputs of the two cells form the symmetrical output of the symmetrizer. The phase shifting inductances and capacitors L and C are arranged as a high-pass filter in one of the cells and a low-pass filter in the other, the phase shifting capacitors C being variable capacitance diodes which are subjected to the tuning control voltage Vtun. This transforming circuit (5) further comprises impedance adapting means which comprise:

- two identical inductances Ls called series adaptation inductances whose value is lower than that of the phase shifting inductances L and which are connected each between the output of a T-cell and one of the output terminals which form the symmetrical output of the transforming circuit (5),
- a capacitor Cp called parallel adaptation capacitor connected between the two outputs of the T-cells,
- and a capacitor Cs called series adaptation capacitor inserted between the asymmetrical input of the transforming circuit and that of the symmetrizing circuit (9).

Finally, the transforming circuit (5) comprises two link capacitors Cl arranged in series between the series adaptation inductances Ls and the output terminals which form the symmetrical output of the transforming circuit (5).

The values of the phase shifting inductances are kept constant in order to simplify the embodiment. The capacitors C thus are to be capable of adopting two values, C1 and C2, which respectively correspond to the tuning of the symmetrizing circuit (9) to the frequency F1 or F2. These values are then to satisfy the two relationships:

$L \cdot C_1 \cdot (2 \cdot PI \cdot F1)^2 = 1$ and $L \cdot C_2 \cdot (2 \cdot PI \cdot F2)^2 = 1$ The ratio F2/F1 being of the order of 2, the ratio C1/C2 will thus be of the order of 4. Such a variation is rendered possible by the use of variable capacitance diodes whose inverse bias voltages and whose capacitances are determined by two different values of the tuning voltage Vtun. A choice of values can be, for a same value L, for example, of the order of 12 nH, C1 of the order of 2.5 pF and C2 of the order of 0.6 pF. The output impedance of the symmetrizing circuit (9) will thus vary depending on whether it will be tuned to the first or the second frequency band, the phase shifting capacitors C adopting different values. However, the input impedance of the low-noise amplifier (6) also adopts different values depending on whether it operates in the first or second frequency band. The impedance adaptation elements Ls, Cp and Cs adapt the impedance seen on the output of the symmetrizing circuit (9) to the input impedance of the low-noise amplifier (6). The structure of the impedance adapting means is noteworthy because it effects, via fixed-value elements, an optimum adaptation of the impedances in their real components and a compensation for the reactive components in the two frequency bands used. The elements Ls, Cp and Cs could be determined precisely by means of a computer program in which the characteristic features of the input impedance of the low-noise amplifier (6) will be introduced. Such a computer program will, for example, produce the following values:

Ls=5.25 nH, Cp=0.9 pF and Cs=2.8 pF.

The sole function of link capacitances Cl is to eliminate the DC components from the signals travelling between the transforming circuit (5) and the low-noise amplifier (6) which components could alter the polarization of the low-noise amplifier (6) and thus be harmful to the operation of the telephone, as, for example, the DC component of the output signal Vs which comes from the tuning control voltage Vtun. Values of the order of 10 pF will be selected for the decoupling capacitances, so that they do not have any significant influence on the tuning of the symmetrizing circuit (9) nor on the impedance adaptation between this symmetrizing circuit and the low-noise amplifier (6). Similarly, the value of the resistor R receiving the tuning control voltage Vtun will be selected as being relatively large compared to the impedances of the other elements of the circuit. For example, R=10,000 ohms will be chosen.

We claim:

1. A wireless telephone comprising:

a first antenna tuned to a first frequency band;

a second antenna tuned to a second frequency band;

a frequency management device for providing a control signal and a tuning voltage based on a selected mode of operation;

a transforming circuit which has an asymmetric input terminal and two output terminals;

a selection device which selects connection of said transforming circuit to one of said first antenna and said second antenna in response to said control signal;

an amplifier having amplifier inputs connected to said two output terminals of said transforming circuit;

said asymmetric input terminal receiving an asymmetrical input signal from one of said first antenna and said second antenna, and said two output terminals providing a symmetrical output signal to said amplifier for amplification and conversion to an intermediate frequency signal;

said transforming circuit including a symmetrizing circuit which receives said asymmetric input signal and outputs intermediate symmetrical signals, said intermediate symmetrical signals being tuneable to one of said first frequency band and said second frequency band in response to said tuning voltage.

2. The wireless telephone of claim 1, wherein said symmetrizing circuit has a high pass filter and a low pass filter connected in parallel and having a common input connected to said asymmetric input terminal; each of said filters having a phase shifting inductor and a variable capacitor controlled by said tuning voltage, wherein said intermediate symmetrical signals are provided from nodes located between said phase shifting inductors and said variable capacitors.

3. The wireless telephone of claim 2, wherein said transforming circuit includes an impedance adapter connected between said symmetrizing circuit and said amplifier.

4. The wireless telephone of claim 3, wherein said impedance adapter includes:

a first and second series adaptation inductors each having a lower inductance than an inductance of said phase shifting inductor, said first and second series adaptation inductors being connected between said nodes and said two output terminals, respectively;

a parallel adaptation capacitor connected between said nodes; and a series adaptation capacitor connected between said asymmetrical input terminal and said selection device.

* * * * *